(12) United States Patent
Iyer et al.

(10) Patent No.: US 6,323,535 B1
(45) Date of Patent: Nov. 27, 2001

(54) ELECTRICAL FUSES EMPLOYING REVERSE BIASING TO ENHANCE PROGRAMMING

(75) Inventors: Sundar K. Iyer, Beacon; Peter Smeys, White Plains; Chandrasekhar Narayan, Hopewell Junction; Subramanian Iyer, Mt. Kisco; Axel Brintzinger, Fishkill, all of NY (US)

(73) Assignees: Infineon Technologies North America Corp., San Jose, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/595,764

(22) Filed: Jun. 16, 2000

(51) Int. Cl.$^7$ .................................................. H01L 29/00
(52) U.S. Cl. ..................... 257/529; 257/528; 257/530; 438/215; 438/281; 438/333
(58) Field of Search .................................. 257/528, 529, 257/530; 438/132, 215, 281, 333, 467

(56) References Cited

U.S. PATENT DOCUMENTS 3,975,683   8/1976   Behrens et al. .
4,517,583 * 5/1985   Uchida ................................ 357/41
5,661,331   8/1997   Hebbeker et al. .

FOREIGN PATENT DOCUMENTS 1-169942-A * 7/1989 (JP) .

* cited by examiner

Primary Examiner—Tom Thomas
Assistant Examiner—Donghee Kang
(74) Attorney, Agent, or Firm—Stanton C. Braden

(57) ABSTRACT

A fuse for semiconductor devices, in accordance with the present invention, includes a cathode including a first dopant type, and an anode including a second dopant type where the second dopant type is opposite the first dopant type. A fuse link connects the cathode and the anode and includes the second dopant type. The fuse link and the cathode form a junction therebetween, and the junction is configured to be reverse biased relative to a cathode potential and an anode potential. A conductive layer is formed across the junction such that current flowing at the junction is diverted into the conductive layer to enhance material migration to program the fuse.

16 Claims, 2 Drawing Sheets

ELECTRICAL FUSES EMPLOYING REVERSE BIASING TO ENHANCE PROGRAMMING

BACKGROUND

1. Technical Field

This disclosure relates to fuses for semiconductor devices and more particularly, to electrical fuses with characteristics to enhance the efficiency of fuse programming.

2. Description of the Related Art

In semiconductor devices, fuses are employed in a variety of applications. For example, fuses are employed to enable redundant elements to be employed in the case of failures encountered on the semiconductor device. Some of these fuses are electrically programmable, i.e.; they are programmed by applying electric voltage or current. These electrically programmable fuses may be fabricated to include poly-silicide. Poly-silicide includes polycrystalline silicon and an overlayer of silicide, such as a metal silicide. The electrically programmable fuses typically include an appropriately shaped polysilicon layer that is silicided to obtain a poly-silicon/metal silicide stack structure.

Referring to FIG. 1, a layout (shape) of a fuse 10 is shown. Fuse 10 includes a fuse link 12, an anode 14 and a cathode 16. Current crowding takes place around a location 18 where the fuse link 12 abuts the cathode 16, when a bias is applied to set or program the fuse. When a poly-silicide fuse is programmed, the cathode is negatively biased and the anode is positively biased. The current crowding initiates electro-migration effects at the fuse link 12 resulting in further current crowding and finally for appropriate bias conditions, the poly-silicide line melts or the silicide agglomerates to result in an open circuit or a high resistance state (i.e., the fuse gets programmed) at the location 18. The effect of material migration due to, for example, electro-migration can be increased at the cathode-fuse link junction by increasing the ratio of $L_{cathode}$ to $L_{fuse}$, as this encourages current crowding. In typical layouts, the thickness of the fuse link 12, the anode 14 and the cathode 16 are the same thickness because they are formed on the same level. Therefore, the lengths of $L_{cathode}$ and $L_{fuse}$ are determinative of the effective cross-sectional area of the fuse link/anode intersection. A polysilicon layer 20 and a silicide layer 22 as shown in FIG. 2 are provided at a uniform thickness for the fuse link 12, the anode 14 and the cathode 16. A nitride capping layer 24 is also provided over layers 20 and 22. Typical electrically programmable fuses require current flow and voltage levels at an appropriate level for a requisite amount of time to program the fuse.

Therefore, a need exists for an apparatus and method to initiate and aid mass transport processes near a fuse link/cathode intersection to reduce the programming current, voltage and time. These reductions are desirable for the electrical fuse technology to minimize energy consumption and the cost of programming fuses.

SUMMARY OF THE INVENTION

A fuse for semiconductor devices, in accordance with the present invention, includes a cathode including a first dopant type, and an anode including a second dopant type where the second dopant type is opposite the first dopant type. A fuse link connects the cathode and the anode and includes the second dopant type. The fuse link and the cathode form a junction therebetween, and the junction is configured to be reverse biased relative to a cathode potential and an anode potential. A conductive layer is formed across the junction such that current flowing at the junction is diverted into the conductive layer to enhance material migration to program the fuse.

Another fuse for semiconductor devices includes a conductive pattern formed on a substrate. The conductive pattern forms a cathode on a first end portion. A fuse link connects the cathode and an anode, and the anode is formed on a second end portion of the conductive pattern. The fuse link and the cathode form a junction therebetween. A conductive layer is formed across the junction such that when the fuse is electrically active the junction is reverse biased and material migration is enhanced to program the fuse.

Yet, another fuse for semiconductor devices includes a polysilicon pattern formed on a substrate. The polysilicon pattern forms a p-doped cathode on a first end portion. An n-doped fuse link connects the cathode and an anode. The anode is formed on a second end portion of the polysilicon pattern. A reverse biased junction is formed at the interface between the cathode and the fuse link. A silicide material is formed across the junction, such that, when the fuse is electrically active, current is diverted from the reverse biased junction into the silicide material to enhance electromigration and program the fuse.

In alternate embodiments, the cathode, anode and fuse link preferably include polysilicon. The conductive layer preferably includes a silicide. The first dopant type may include a p type dopant and the second dopant type includes an n type dopant. The cathode preferably has a larger cross-sectional area than the fuse link. The cathode and the fuse link may provide an interface of the junction, which is substantially perpendicular to a current flow direction through the fuse link. The polysilicon of the cathode is preferably p-doped, and the polysilicon of the fuse link is preferably n-doped.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides an apparatus and a method to initiate and aid material migration near a fuse link/cathode intersection to perform a fusing operation. In accordance with the invention, methods are provided to enhance the current crowding at the fuse link by creating a reverse biased p+/n+ junction in a fuse. In one embodiment, a polysilicon layer is formed with a silicide layer thereon. The polysilicon is doped to form the reverse biased p+/n+ junction. This provides increased current at the junction. The enhanced current crowding will result in faster initiation of the electromigration in the fuse link. This would aid in faster programming of the fuse (lower programming voltage/current/time). The reverse biased junction along with shape of the fuse layout may also be employed in localizing the fuse blow.

In one embodiment, the intersection includes a cathode material, which is doped differently from the anode/fuse link material, such that material migration is enhanced to provide a break or increased resistance in the fuse link in less time and with less severe current and/or voltage levels. In one embodiment, a silicided layer is employed adjacent to the anode, the fuse link, and the cathode. This structure advantageously reduces the programming current, voltage and time by increasing current density in the silicided layer, as will be explained below.

One embodiment of the present invention provides a silicide layer, which exacerbates the material migration process further by providing a less resistive path than the reverse biased junction. This increases the current density in the silicide, thus initiating the voids in the cathode-fuse link junction at a faster rate. The higher conductivity of the silicide also provides current crowding in the vertical direction at the fuse link and cathode junction further aiding electron migration. This abetting of the material migration process advantageously permits lower programming voltage/current and shorter programming time. In one embodiment, voltages and/or current are reduced by a factor of at least two and the programming time is reduced by a factor of about 100. Although described in terms of silicide and polysilicon materials, these materials should not be construed as limiting the present invention. Instead, these materials are employed to illustrate the present invention in one application.

Figure 1:
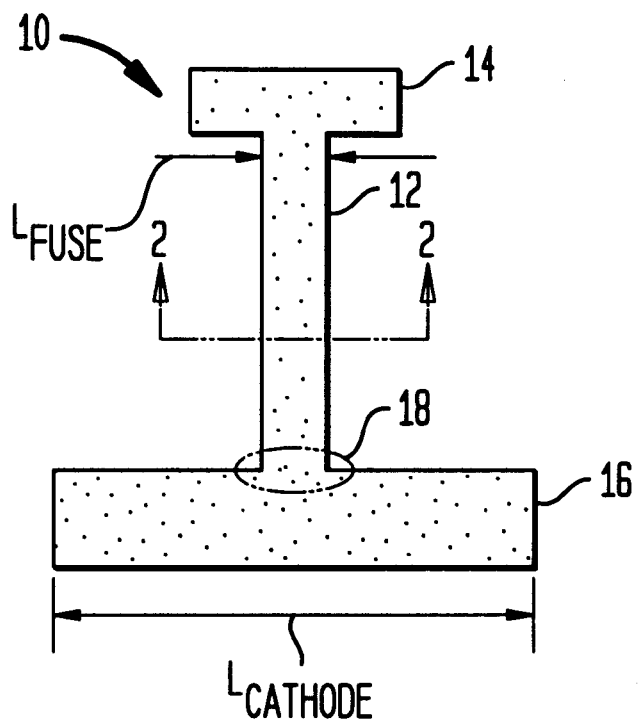
FIG. 1 is a top view of a fuse structure in accordance with the prior art.
Figure 2:
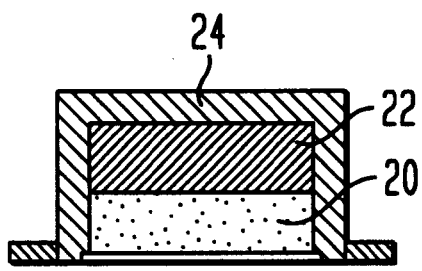
FIG. 2 is a cross-sectional view of a fuse link for the fuse structure of FIG. 1.
Figure 3:
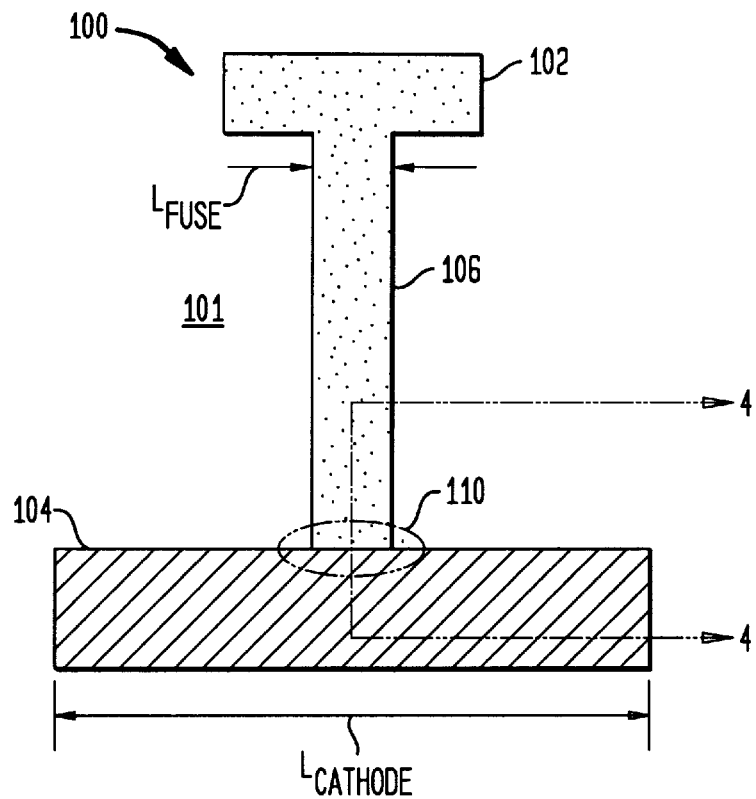
FIG. 3 is a top view of a reverse biased fuse structure for enhancing fuse programming in accordance with the present invention.

Referring now in specific detail to the drawings in which like reference numerals identify similar or identical elements throughout the several views, and initially to FIG. 3, a fuse structure or fuse 100 is shown in accordance with the present invention. Fuse 100 includes an anode 102 and a cathode 104 for providing current flow across a fuse link 106 that connects anode 102 to cathode 104. Anode 102, cathode 104 and fuse link 106 are preferably disposed on a substrate 101 (see, e.g., FIG. 3), which may include a semiconductor substrate, diffusion regions, metal lines, dielectric layer(s) and other components. In one illustrative embodiment, when fuse 100 is programmed, cathode 104 is negatively biased and anode 102 is positively biased. However, cathode 104 advantageously includes p+ dopants while fuse link 106 and anode 102 include n+ dopants. This configuration provides a reverse bias through region 110 between cathode 104 and fuse link 106.

A reduction in cross-sectional area (which is proportional to the width in this embodiment) from $L_{cathode}$ to $L_{fuse}$ results in additional current crowding in a region 110. The increased current density will result in material migration (or electro-migration) in region 110. The material migration causes voids to form at the corners of fuse link 106 and cathode 104, and further increases the current density. This ultimately results in fuse link 106 melting thereby causing an open in the fuse circuit or a material segregation thereby causing an increased resistance in the fuse. Cathode 104 and anode 102 preferably include polysilicon, which may be appropriately doped to cause the reverse biasing in accordance with the present invention. In a preferred embodiment, a conductive layer, e.g., a silicide layer, (not shown in FIG. 3) is formed in contact with cathode 104 and fuse link 106 in region 110.

Figure 4:
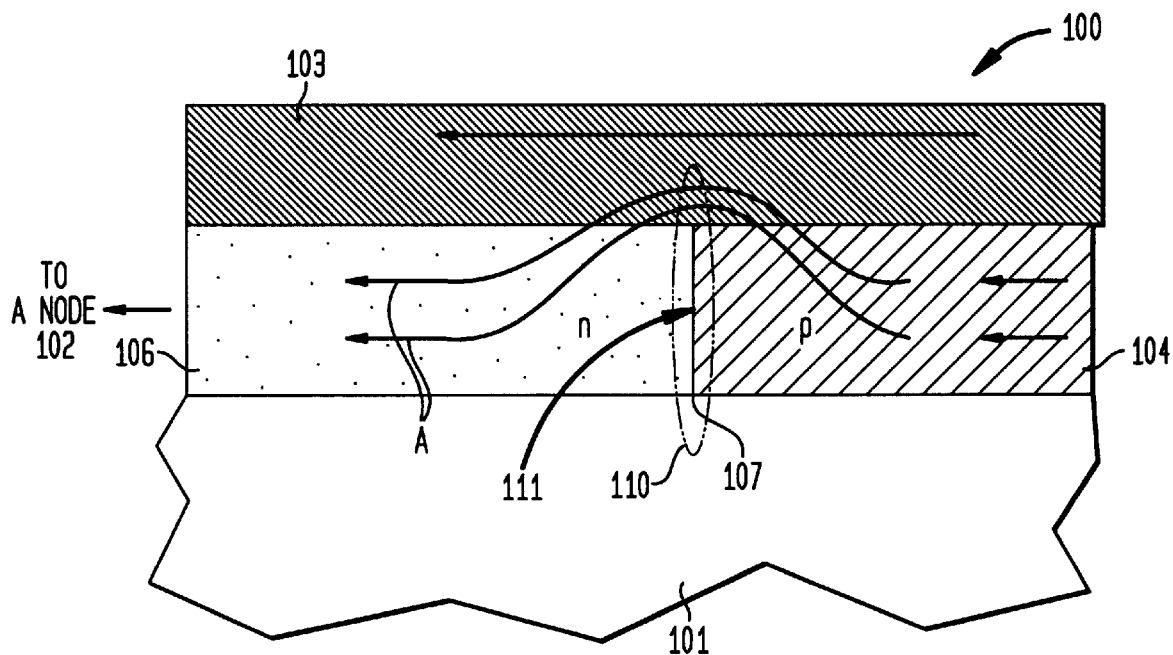
FIG. 4 is a cross-sectional view of at a junction taken at section line 4—4 of FIG. 3 in accordance with the present invention.

Referring to FIG. 4, a cross-sectional view of region 110 is shown. The present invention advantageously exacerbates fuse programming. In the illustrative structure shown in FIG. 4, cathode 104 is formed from polysilicon and is doped with p+ dopants. p+ may include for example, boron, aluminum or gallium. Fuse link 106 and anode 102 are doped with n+ dopants, which may include, for example, phosphorus, arsenic or antimony. The p+/n+ junction is formed at the meeting point of fuse link 106 and cathode 104. Dopant concentration for cathode 104 preferably include between about $10^{15}$ and about $10^{22}$ atoms/cm$^3$. Dopant concentration for anode 102 and fuse link 106 preferably includes between about $10^{15}$ and about $10^{22}$ atoms/cm$^3$.

A conductive layer 103 is formed in electrical contact with region 110. Conductive layer 103 may be formed locally at the cathode/fuse link junction or may extend over a larger area (e.g., along the length of cathode, fuse link, and/or anode). Conductive layer 103 preferably includes a silicide, such as, for example, cobalt silicide or other material such as tungsten silicide, nickel silicide or metals, such as aluminum. When cathode 104 is negatively biased and anode 102 is positively biased, p+/n+ junction 111 is reverse biased. Hence, no current can flow through the doped polysilicon. As indicated by arrows A, the electrons, which carry the current, will crowd in conductive layer 103 above the reverse biased junction. It is to be understood that conductive layer may be formed on top of, below or on a lateral side of junction 111.

In addition, lateral current crowding due the large ratio of $L_{cathode}$ to $L_{fuse}$ is enhanced by vertical current crowding due to the reverse biased junction 111. Most of the electrons that carry the current will be crowded in the silicide in fuse link 106 at the junction. Advantageously, this current crowding in the vertical direction at a substantially perpendicular interface 107 adds to the crowding due the shape of the large cathode connected to the narrow fuse link 106, and further amplifies the material migration effect at this junction. The fuse programming therefore takes place faster and at a lower voltage/current for fuse 100. This means that the fuse can advantageously be programmed at a lower voltage/current and in a shorter time than prior art structures.

It is preferable, to ensure current crowding will result in a localized fusing action and quicker fuse programming, that the resistance of conductive layer 103 (e.g., silicide) and doped polysilicon of cathode 104 and fuse link 106 in region 110 are comparable. This can be ensured by the use of silicides for layer 103 with lower resistivity and by appropriately choosing the thickness of the silicide (103) and the polysilicon layers (cathode 104, fuse link 106 and anode 102). Silicide resistivity may be about 5 to 10 ohms per square. The resistivity of the polysilicon can be more than one order of magnitude different. In one illustrative embodiment, for a cobalt silicide (layer 103) and polysilicon layer (cathode 104, fuse link 106 and anode 102) combination, the silicide may include a thickness of between about 20 nm to about 50 nm and the polysilicon may include a thickness of between about 100 nm and about 200 nm. In other embodiments, vertical current crowding is enhanced by increasing the polysilicon (e.g., cathode 104, fuse link 106 and anode 102) thickness and decreasing the conductive layer 103 thickness. The for the cobalt silicide/polysilicon combination, the silicide may be, for example, reduced in thickness to 5 nm to 10 nm, while the polysilicon thickness is increased to say, 500 nm. In such a situation, the vertical current crowding will be increased. Other thicknesses and materials may be employed as well.

The reverse biased junction is used to initiate a fuse blowing process faster. The reverse bias in the poly-silicon will show a higher resistance for the programmed state if the silicide is opened up but the poly-silicon is not fully opened up. In any event, a larger difference in fuse resistance between the unprogrammed state and programmed is expected. The fuse of the present invention combines the advantage of both lateral and vertical current crowding into the fuse link from the cathode. This fuse also localizes the fuse blowing location.

The present invention may be extended to any junction formed with a reverse biased interface or junction with a conductive path in contact with the junction. In addition, different geometry may be employed for the cathode, anode and fuse link. For example, the p/n junction may be formed between the fuse link and the anode. Different levels of doping may be employed on the cathode and fuse link, for example, n+/p, n/p+, etc.

Having described preferred embodiments electrical fuses employing reverse biasing to enhance programming (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A fuse for semiconductor devices comprising:
   a cathode including a first dopant type;
   an anode including a second dopant type where the second dopant type is opposite the first dopant type;
   a fuse link connecting the cathode and the anode and including the second dopant type; and
   the fuse link and the cathode forming a junction therebetween, the junction being configured to be reverse biased relative to a cathode potential and an anode potential; and
   a conductive layer formed across the junction such that current flowing at the junction is diverted into the conductive layer to enhance material migration to program the fuse.

2. The fuse as recited in claim 1, wherein the cathode, anode and fuse link include polysilicon.

3. The fuse as recited in claim 1, wherein the conductive layer includes a silicide.

4. The fuse as recited in claim 1, wherein the first dopant type includes an p type dopant and the second dopant type includes an n type dopant.

5. The fuse as recited in claim 1, wherein the cathode has a larger cross-sectional area than the fuse link.

6. The fuse as recited in claim 1, wherein the cathode and the fuse link provide an interface of the junction, which is substantially perpendicular to a current flow direction through the fuse link.

7. A fuse for semiconductor devices comprising:
   a conductive pattern formed on a substrate, the conductive pattern forming a cathode on a first end portion;
   a fuse link connecting the cathode and an anode, the anode being formed on a second end portion of the conductive pattern, the fuse link and the cathode forming a junction therebetween; and
   a conductive layer formed across the junction such that when the fuse is electrically active the junction is reverse biased and material migration is enhanced to program the fuse.

8. The fuse as recited in claim 7, wherein the material of the conductive pattern includes polysilicon.

9. The fuse as recited in claim 8, wherein the polysilicon of the cathode is p-doped.

10. The fuse as recited in claim 8, wherein the polysilicon of the fuse link is n-doped.

11. The fuse as recited in claim 7, wherein the conductive layer includes a silicide.

12. The fuse as recited in claim 7, wherein the cathode and the fuse link provide an interface, which is substantially perpendicular to a current flow direction through the fuse link.

13. The fuse as recited in claim 7, wherein the cathode has a larger cross-sectional area than the fuse link.

14. A fuse for semiconductor devices comprising:
   a polysilicon pattern formed on a substrate, the polysilicon pattern forming a p-doped cathode on a first end portion;
   an n-doped fuse link connecting the cathode and an anode, the anode being formed on a second end portion of the polysilicon pattern;
   a reverse biased junction formed at the interface between the cathode and the fuse link;
   a silicide material formed across the junction, such that, when the fuse is electrically active, current is diverted from the reverse biased junction into the silicide material to enhance electromigration and program the fuse.

15. The fuse as recited in claim 14, wherein the cathode has a larger cross-sectional area than the fuse link.

16. The fuse as recited in claim 14, wherein the polysilicon of the cathode and the polysilicon of the fuse link provide an interface which is substantially perpendicular to a current flow direction through the fuse link.

* * * * *